May 16, 1950 M. D. TYLER 2,508,310

INDEXING DEVICE

Filed Nov. 23, 1945 3 Sheets-Sheet 1

Inventor
Merle D. Tyler
BY
Mann and Brown
Attorneys.

May 16, 1950 M. D. TYLER 2,508,310

INDEXING DEVICE

Filed Nov. 23, 1945 3 Sheets-Sheet 2

Inventor
Merle D. Tyler
BY
Mann and Brown
Attorneys.

May 16, 1950 M. D. TYLER 2,508,310

INDEXING DEVICE

Filed Nov. 23, 1945 3 Sheets-Sheet 3

Inventor
Merle D. Tyler
By Mann and Brown
Attorneys.

UNITED STATES PATENT OFFICE 2,508,310

INDEXING DEVICE

Merle D. Tyler, Villa Park, Ill.

Application November 23, 1945, Serial No. 630,445

7 Claims. (Cl. 192—142)

My invention relates to controls or indexing means for turning a rotary member to predetermined stations of rotation selectively, and is directed especially to the problem of indexing stations distributed over a range covering several rotations of the rotary member. For the purpose of disclosure the invention will be described as embodied in a tuner for television receivers, F. M. receivers, and the like.

The operating member of a tuner of the character here involved has a range of several revolutions, for example, a range on the order of 3600° of rotation, and must be accurately positioned at various predetermined points or stations in that range for tuning the receiver to the frequencies of various broadcasting transmitters.

The general object of the present invention is to provide an automatic indexing device of the type known as a push-button control for tuning such an operating member or tuner to selected predetermined stations.

One problem in the construction of an automatic push-button control for tuning is to avoid excessive complexity in the structure and mechanism. A problem that is often more troublesome is to achieve desirable compactness in the size of the automatic control unit. Devices heretofore proposed have been both complicated and unduly large.

Another object of my invention is to meet both of these problems by providing a relatively simple mechanism that occupies very little space. A feature of the present invention that is new in the art is the reduction in the space required by a control unit comprising thirteen or more push buttons to the exceedingly small dimensions of 4 x 4 x 6".

Since sharp tuning is required the tuner must not only be tuned to the various stations with precision, but must also be prevented from driving or creeping when set for particular stations. A further object of my invention is to provide a push-button control that normally maintains the tuner locked at the selected stations in a positive manner that precludes any drift or creeping whatsoever.

A push-button control must be set or adjusted for whatever stations are selected for automatic tuning. Usually the procedure of setting or resetting the push-button control requires such complicated manipulations that the procedure can be carried out only by a highly skilled technician. It would be desirable to so simplify the setting and resetting procedure as to enable the average purchaser to adjust the push-button control without outside help, the purchaser being free to change the selected stations at will. It is one object of the invention to make the setting and resetting procedure so simple as to require no skill whatsoever.

A feature of the preferred practice of my invention is that all of the manipulations required are made entirely on the exterior of the control unit and without the use of any tools whatsoever.

A still further object in mind is to provide means for automatically releasing the tuner from push button control whenever the tuner is manually manipulated for reaching stations other than the stations selected for automatic control.

In general these objects are attained by a combination including a plurality of detent means corresponding to the plurality of selected stations, a plurality of first indexing means operatively connected to the tuner, which indexing means rotate on a given axis, and a plurality of second indexing means operatively connected with the first plurality of indexing means, the second plurality of indexing means being located to one side of said axis. Each of the detent means is adapted for positive locking engagement with the corresponding first indexing means, and the corresponding second indexing means serves to prevent such engagement during rotation of the first indexing means except when the first indexing means is in that one of its series of rotations in which the corresponding selected station lies.

The above and other objects and advantages of my invention will be apparent in the following detailed description taken with the accompanying drawings.

In the drawings, which are to be regarded as merely illustrative:

*General arrangement*

Figures 1, 2, 3:
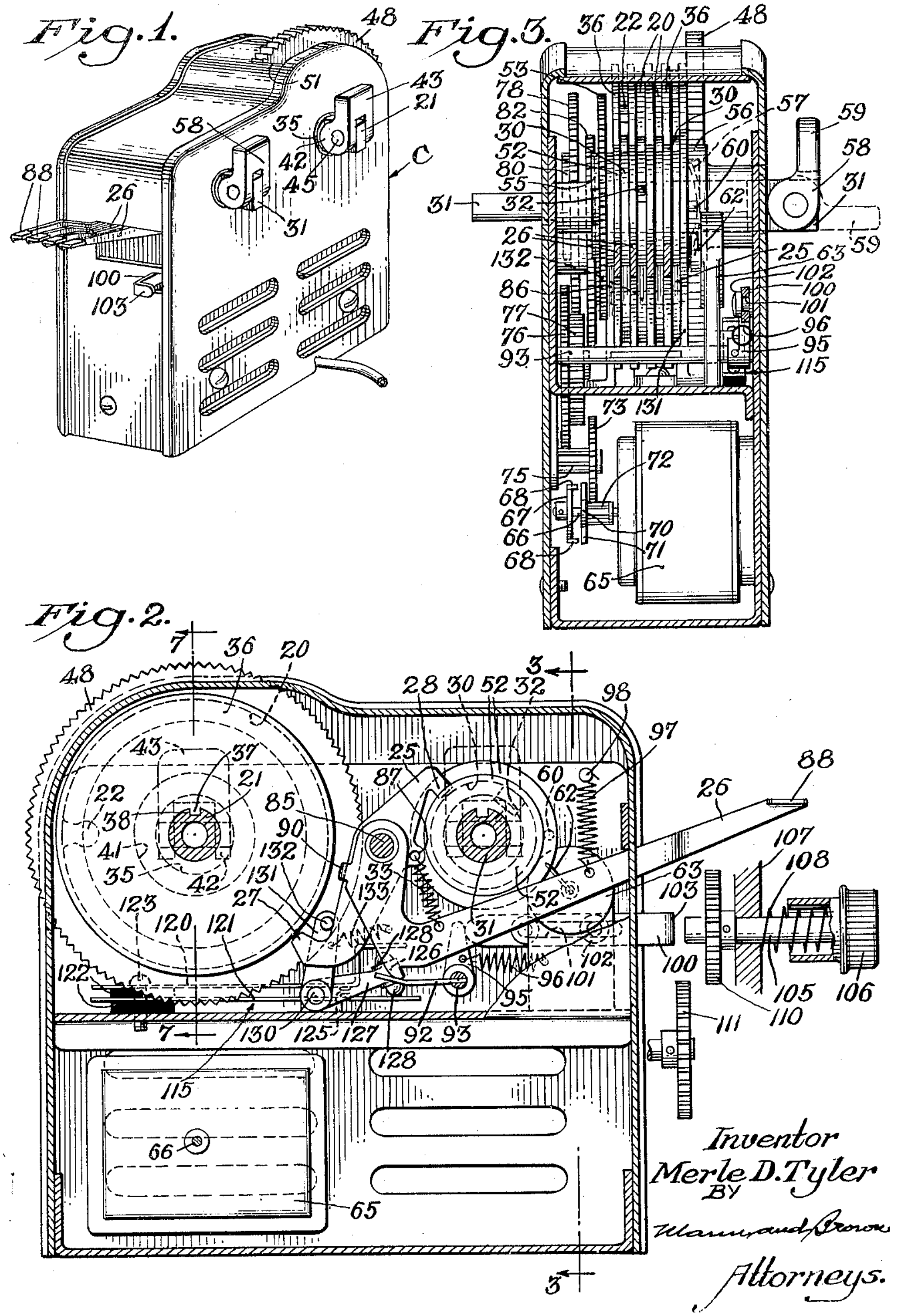
Fig. 1 is a perspective view of a control unit embodying the preferred practice of my invention.
Fig. 2 is a longitudinal vertical section of the device shown in Fig. 1.
Fig. 3 is a transverse section taken as indicated by the line 3—3 of Fig. 2.

For clarity of illustration the drawings show a preferred embodiment of the invention constructed for automatic tuning to only four stations, but it is to be understood that the control may be extended to any number of stations. For example, the device may cover thirteen or more stations. As best shown in Fig. 1, the device may be housed in a suitable casing, generally designated C, which casing may in turn be largely enclosed by the housing of a tuner with which it cooperates.

Figure 9:
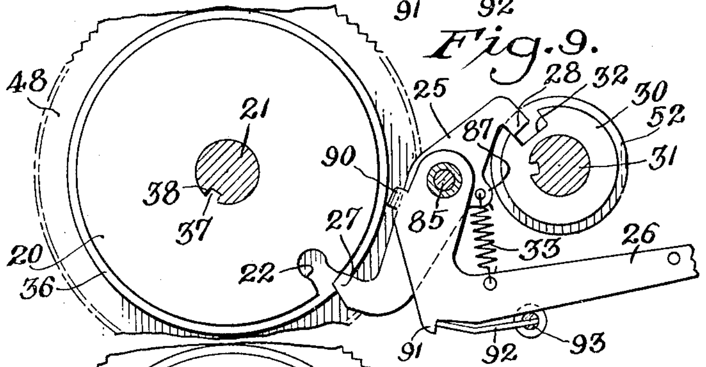

The plurality of first indexing means is in the form of a plurality of discs 20, mounted on what may be termed a first shaft 21 for rotation therewith. The first shaft 21 is to be connected to a tuner control or operating member (not shown) that rotates through, say, 3600° in covering a complete tuning range including several stations selected for automatic control. Preferably the first shaft 21 is directly connected to the tuner member so that the shaft and the first indexing discs 20 thereon will rotate through the same range of 3600°, each of the indexing discs going through ten complete rotations to cover the complete range. Each of the discs 20 is provided with a suitable peripheral indexing notch or recess 22, which is preferably formed with converging sides and an enlarged bottom or inner end, as best shown in Fig. 9.

Corresponding to the plurality of discs 20 is a plurality of detent means, each of which, in the present construction, comprises a detent member 25 and an associated control member 26. Each detent member 25 is in the form of a lever having a detent tooth 27 on one end for engagement with the indexing notch 22 of the corresponding disc 20 and having a detent tooth 28 on its other end.

The plurality of first indexing means or discs 20 is operatively connected to a second plurality of indexing means for movement simultaneously therewith. Rotary movement on the part of the second indexing means is preferred over rectalinear movement, and it is further preferred that the two pluralities of indexing means be operatively interconnected through reduction gearing to shorten the range of movement of the second indexing means.

In the present construction the plurality of second indexing means may comprise a plurality of discs 30, mounted on a second shaft 31 for rotation therewith, the two shafts being operatively interconnected by suitable gears. Each of the second indexing means or discs 30 rotates through a number of zones or positions, each of which zones or positions represents a fraction of the range of movement of the corresponding first indexing means 20, which fraction is not greater than one complete rotation of the first indexing means and preferably is much less. The underlying relationship may be approached from a somewhat different viewpoint by regarding each of the second indexing means 30 as divided into portions or zones each of which is moved into register with the corresponding detent tooth 28 whenever the corresponding first indexing disc 20 rotates into a fraction of the 3600° range that includes the corresponding station of the tuner.

On each of the second indexing discs 30 such a portion or zone corresponding to a fraction of the total range is represented by a relatively wide indexing notch or recess 32 to receive the corresponding detent tooth 28.

Prior to operation of the device to automatically tune in a given station the detent member 25 corresponding to the station will normally be in a retracted position with the detent tooth 27 completely withdrawn from the corresponding disc 20 and the detent tooth 28 likewise completely withdrawn from the corresponding indexing disc 30, this position of the detent member being indicated in Fig. 2. It will be noted in Fig. 2 that the corresponding control member 26 is likewise in an upper or normally retracted position.

Figures 7, 8, 11, 12:
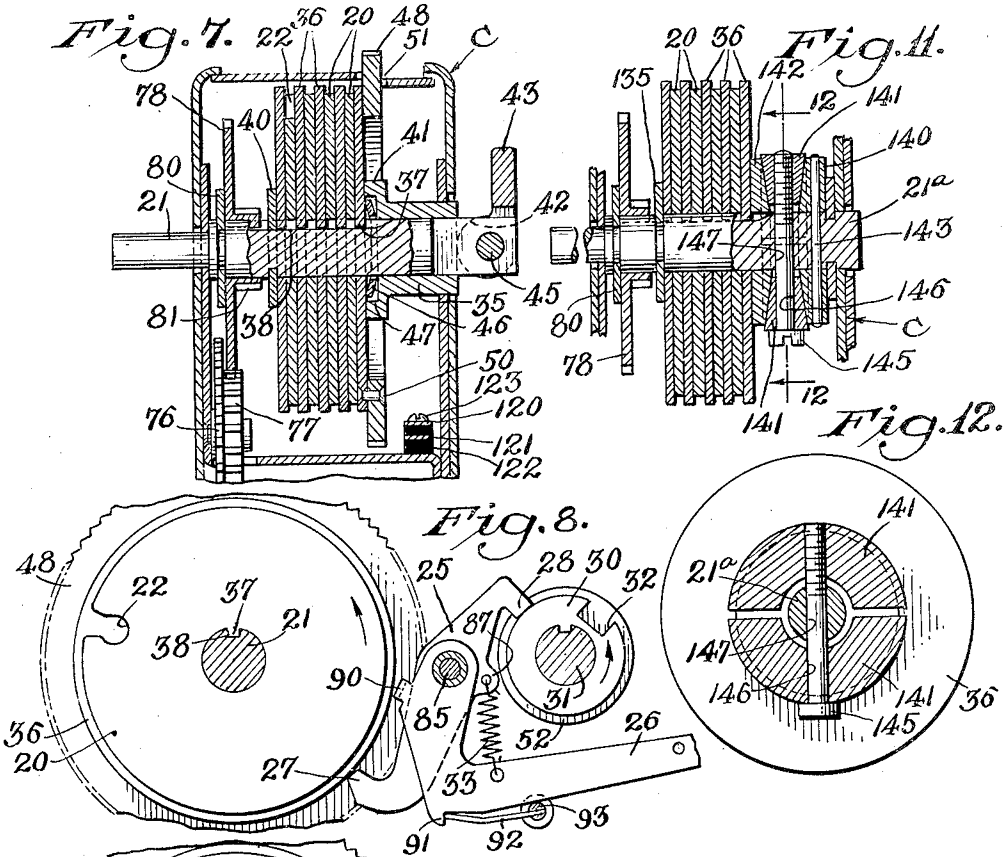
Fig. 7 is a section taken as indicated by the line 7—7 of Fig. 2.
Figs. 8, 9 and 10 are diagrammatic views showing parts of the mechanism at different stages in the cycle of operations.
Fig. 11 is a sectional view similar to Fig. 7, indicating how a portion of the mechanism may be modified.
Fig. 12 is a section taken as indicated by the line 12—12 of Fig. 11.
Figure 10:
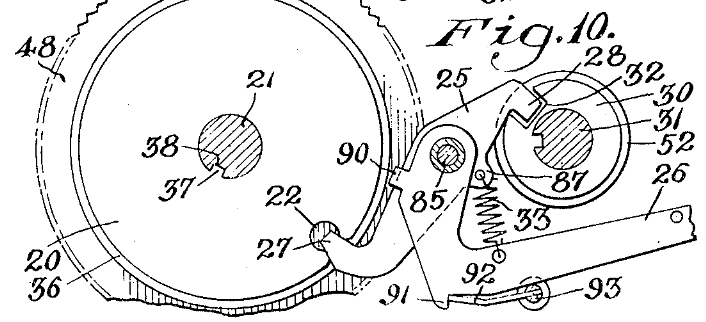

To cause the device to operate for automatically tuning in the desired station the corresponding control member 26 is depressed for movement to its effective position, which effective position is shown in Figs. 8, 9 and 10. A suitable latch holds the control member depressed. This movement of the control member causes the detent member 25 to move to an intermediate position shown in Fig. 8, at which position a spring 33 urges the detent tooth 28 against the periphery of the corresponding disc 30, the tooth being out of register with the corresponding index notch 32. In effect the disc 30 blocks rotation of the detent member 25 into engagement with the corresponding disc 20.

The depressing of the control member 26 and the consequent movement of the corersponding detent member 25 from its retracted position to its intermediate position causes a reversible motor to be energized for rotation of the two discs 20 and 30, with corresponding rotation of the first shaft 21 for changing the setting of the tuner. For example, the first shaft 21 and the disc 20 may rotate counterclockwise as viewed in Fig. 8, the corresponding rotation of the second shaft 31 and disc 30 being also counterclockwise.

Since the detent tooth 27 is out of range of the disc 20 that represents the given station, the disc 20 is free to rotate as many times as necessary to reach that fraction of the 3600° in which the given station lies. When that fraction is approached in the rotation of the disc 20, the corresponding disc 30 reaches the position shown in Fig. 9, whereupon the detent tooth 28 drops into the index notch 32. The detent member is now in a second intermediate position which may be termed a position effective for engagement with the corresponding disc 20. As soon as the index notch 22 on the disc 20 reaches the position shown in Fig. 10, the detent tooth 27 is urged into the notch by the spring 33 to bring the mechanism to a halt. The detent member 25 is then in what may be termed its engaged position, and is maintained in this engaged position to immobilize the mechanism in a positive manner. The motor circuit is, of course, deenergized in response to movement of the detent member 25 to the effective position.

*The two pluralities of indexing means*

As best shown in Fig. 7, the first shaft 21 is journaled at one end in the wall of the casing C and at the other end is surrounded by a sleeve 35 that is journaled in the casing. The indexing discs 20 having the index notches 22 are freely rotatable on the first shaft 21 but alternate with a series of plates 36 that are slidingly but non-rotatably mounted on the shaft, each disc lying between two of the plates. In the present construction each of the plates 36 is formed with a radial inwardly directed tongue 37 that slidingly extends into a longitudinal groove or keyway 38 in the shaft 21. It is apparent that the plurality of plates 36 may be placed under pressure to cause all of the index discs 20 to rotate in unison with the shaft 21 and in fixed relation to each other.

The plurality of plates 36 is abutted on one side by a split washer 40 that seats in a suitable circumferential groove in the shaft, and is abutted on the other side by the enlarged inner end 41 of the previously mentioned sleeve 35. The position of the sleeve 35 is controlled by suitable means, such as an eccentric member 42, on the end of the shaft 21. The eccentric member 42, which has a small handle portion 43, straddles the end of the shaft 21 and is pivotally mounted thereon by a suitable pin 45. When the handle portion 43 is substantially parallel with the casing C, as shown in Figs. 1 and 7, the eccentric member 42, acting against the outer end of the sleeve 35, urges the sleeve against the plurality of plates 36 thereby cooperating with the split washer 40 to place the plates under the sufficient pressure to unify the discs 20 with the shaft.

When the handle portion 43 is swung outward to its release position, indicated in dotted lines in Fig. 3, the sleeve 35 is permitted to retract to a slight extent to greatly lessen the pressure across the plurality of plates 36. Preferably the pressure is not relieved entirely, the lessened pressure being great enough to cause each of the discs 20 to follow the rotation of the shaft 21 in the absence of opposition but being small enough to permit each of the discs to be rotatively adjusted on the shaft. Since each of the discs 20 is isolated by the two adjacent plates 36, the adjustment of rotation is not transmitted to the other discs. To provide the desired lessened pressure at the release position of the eccentric member 42 I may employ a suitable spring washer 46 housed in an annular recess 47 in the enlarged inner end of the sleeve 35. When the sleeve 35 is permitted to retract from the plurality of plates by the release movement of the eccentric member 42, the spring washer 46, acting against the retracted sleeve, will exert the required minimum pressure on the plates 36.

In the preferred embodiment of my invention means is provided for convenient manual rotation of the first shaft 21. For this purpose I may employ a knurled ring 48 which is attached to one of the plates 36 by suitable screws 50. As best shown in Figs. 1 and 7, the ring 48 is exposed through a slot 51 in the casing C for manual manipulation.

Figure 5:
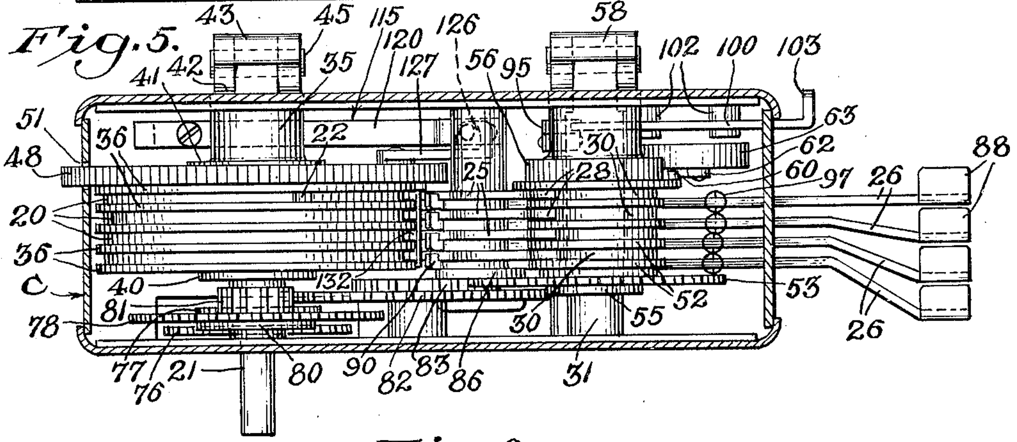
Fig. 5 is a plan view of the mechanism with the casing shown in section.

The discs 30, comprising the second plurality of indexing means, are mounted on the second shaft 31 with a second plurality of plates 52 corresponding to the plates 36 on the first shaft. As best shown in Fig. 5, a gear 53 keyed to the second shaft 31 may serve as a last plate in the series of plates 52, the gear being abutted by a retaining split washer 55. At the other end of the series of plates 52 a sleeve 56, a concealed spring washer 57, and an eccentric member 58 with a handle portion 59 may be provided to function in the same manner as heretofore described.

One of the plates 52 on the second shaft 31 is of relatively large diameter to carry a pin 60 for reversibly operating the arm 62 of a suitable reversing switch 63. The arm 62 is a resilient leaf spring to provide a yielding action and to avoid damage when the pin 60 is inadvertently forced past the arm in the course of manual tuning.

*The driving mechanism*

The two shafts are actuated by a suitable reversible motor 65 (Fig. 3) having a shaft 66 that is axially movable in response to energization and deenergization of the motor. When the motor is energized the shaft 66 shifts axially inward toward the motor from the retracted position of the shaft shown in Fig. 3, and when the motor is deenergized the shaft returns to its retracted position. This action of the shaft is employed to operate a clutch for automatically connecting and disconnecting the motor.

Figure 4:
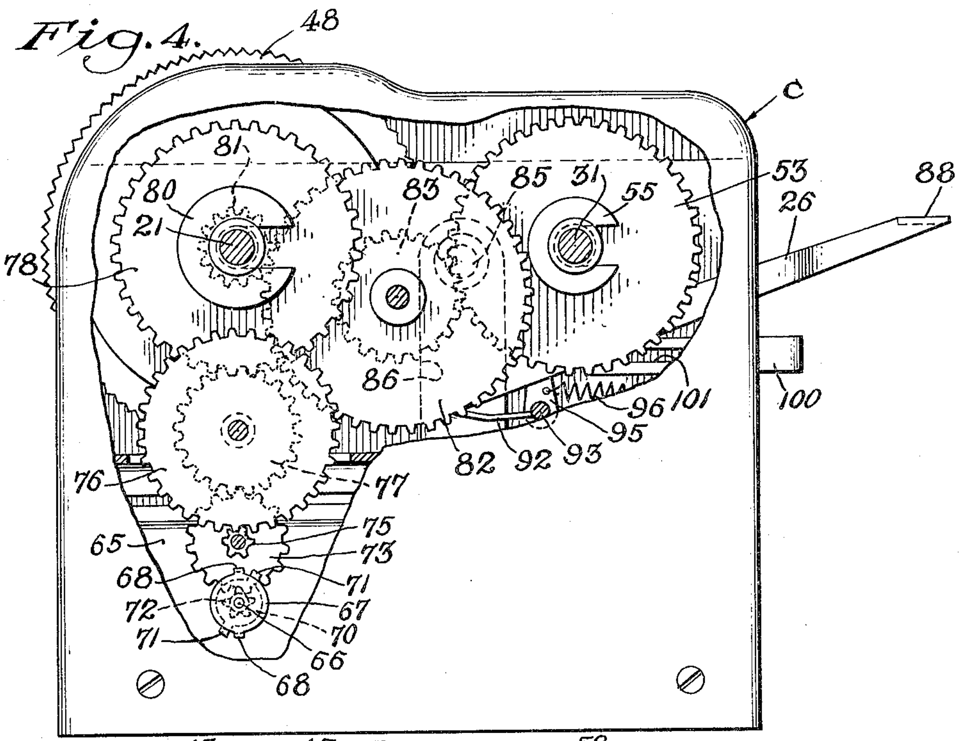
Fig. 4 is a side elevation of the device, with a portion of the wall broken away to reveal the mechanism.

As best shown in Figs. 3 and 4, a clutch member 67, keyed to the outer end of the shaft, has two inwardly directed fingers 68 for cooperation with a second clutch member 70 having a pair of radial fingers 71. The clutch member 70 is integral with a cylindrical gear 72 that is rotatably mounted on the motor shaft 66. It is apparent that energization of the motor 65 will cause the clutch member 67 to be shifted inwardly to bring the fingers 68 into engagement with the fingers 71 for driving the cylindrical gear 72.

The following train of gears operatively interconnects the cylindrical gear 72 with the first shaft 21: gear 73 in mesh with cylindrical gear 72; small gear 75 integral with gear 73; gear 76 in mesh with small gear 75; gear 77 integral with gear 76; and gear 78 in mesh with gear 77. Gear 78 is keyed to the first shaft 21, and is locked against axial movement by a suitable split washer 80.

The first shaft 21 is operatively connected to the second shaft 31 by the following train of gears: a small cylindrical gear 81 integral with the previously mentioned gear 78 on the first shaft 21; a large gear 82 in mesh with gear 81; and a smaller gear 83 integral with the gear 82, the gear 83 being in mesh with the previously mentioned gear 53 on the second shaft 31.

It is apparent that energization of the motor 65 will rotate the first shaft 21, and, by virtue of the described reduction gearing, will rotate the second shaft 31 at reduced speed.

Preferably the reduction gearing interconnecting the two shafts is such that the first shaft 21 will rotate through approximately 10.6 rotations for one rotation of the second shaft 31.

*Detent means*

The detent members 25 and the control members 26 are mounted alternately on a fixed shaft 85, one end of which is supported by the casing C and the other end of which is supported by a standard 86 indicated in dotted lines in Fig. 4. Each of the detent members 25 is formed with a small ear 87 for connection to one end of the corresponding spring 33, the other end of the spring being connected to the corresponding control member 26.

Each of the control members 26 is of angular configuration in profile, as best shown in Fig. 2, and is formed at its outer end into a push button 88 for manual operation. Each of the control members 26 is provided with a finger 90 that extends into the path of rotation of the corresponding detent member 25 to limit the degree to which the detent member may be rotated by the corresponding spring 33.

Suitable latch means is provided for releasably retaining the control members 26 in their lower or effective positions. For this purpose each of the control members 26 is cut away on its under side to provide a latch shoulder 91 for engagement by a latch plate 92. The latch plate 92 extends across the entire series of control members 26 and is carried by a suitable latch shaft 93. On one end of the shaft 93 is keyed an arm 95. A suitable spring 96, attached at one end to the arm 95 and suitably anchored at its other end to the casing C, continually tends to rotate the shaft 93 in a direction to swing the latch plate 92 upward against the plurality of control members 26.

Normally a control member 26 is held in its upper retracted position by a suitable spring 97 that is connected at its lower end to the control member and is anchored at its upper end to a fixed rod 98. When the push button 88 at the end of the control member 26 is depressed, the latch shoulder 91 swings in an arc against the latch plate 92, thereby forcing the latch plate to swing downward with consequent rotation of the latch shaft 93 against the resistance of the spring 96. When the latch shoulder 91 clears the edge of the latch plate the latter moves upward into latching position so that the control member remains in its lower effective position when released by the operator. At the upper retracted position of the control member 26 the finger 90 is effective to hold the corresponding detent member 25 in its retracted position shown in Fig. 2, but shifting the control member to its lower effective position causes corresponding shift of the finger 90 to release the detent member to the intermediate position shown in Fig. 8 and the freedom of movemnt permitted by the new position of the finger 90 permits the control member to subsequently shift to the positions shown in Figs. 9 and 10 in sequence.

At the end of the cycle of indexing operation initiated by the depressing of a push button 88 the control member 26 remains latched in its lower effective position. The subsequent depression of a second push button by the operator for tuning in a different station causes the latch shoulder 91 of a second control member to swing downward in an arc against the latch plate 92, with consequent release of the first control member for retraction by its spring 97 before its second control member reaches the point at which it becomes automatically latched.

Usually a latched control member 26 is released automatically in response to the latching of a second control member as described above. It is apparent, however, that the second control member may be depressed only sufficiently to unlatch the first control member and then may be released so that both control members will be returned to their upper retracted positions by their respective springs 97. Thus while normally one of the plurality of detent members 25 will be in a position locking the mechanism, it is possible to have all of the detent members in their retracted positions when it is desired to manually tune in some station other than the station selected for automatic tuning.

It is desirable to have some means for swinging the latch plate 92 to its release position independently of the control members 26. It is further desirable to have such an independent release means become effective automatically whenever the operator undertakes to tune in a station manually. In the present construction I provide a slide bar 100 for movement against the arm 95 to swing the latch plate 92 to its release position. The slide bar 100 has a longitudinal slot 101 by means of which it is slidingly mounted on two spaced studs 102, as may be understood by referring to Figs. 2 and 5. The outer end of the slide bar 100 is bent to form a handle 103.

The manner in which the indexing mechanism may be completely unlatched in response to manual manipulation for tuning in a station may be understood by reference to Fig. 2. A shaft 105, having a knob 106 for manual manipulation, is rotatably and slidably mounted in a support 107 and is normally held in an outer ineffective position by a spring 108 in compression between the knob and the support. The outward movement of the shaft 105 is limited by a gear 110 that is keyed to the inner end of the shaft. Inward from the normally retracted position of the gear 110 is a complementary gear 111 which is connected by suitable means (not shown) with either the first shaft 21 or the tuning member that is normally actuated by the shaft 21. When the operator pushes the knob 106 inward to bring the gear 110 into mesh with the gear 111 for manual tuning, the inner end of the shaft 105 moves against the handle 103 to shift the slide bar 100 for causing the latch plate 92 to be swung to its release position.

*Motor control*

Figure 6:
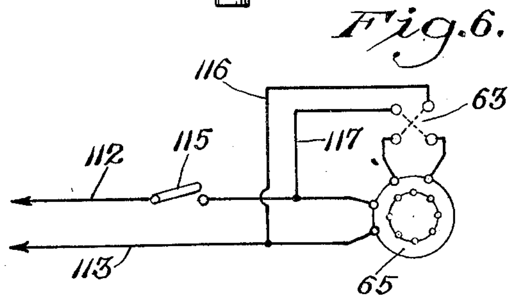
Fig. 6 is a wiring diagram of the electrical arrangement.

The wiring diagram in Fig. 6 shows the preferred electrical arrangement for controlling the motor 65. Energization of the motor through leads 112 and 113 is controlled by a switch 115. Shunt wires 116 and 117 connect the leads 112 and 113 with the reversing switch 63 and the field coils of the motor. The construction of the preferred form of the control switch 115 will now be described.

As best shown in Figs. 2 and 7, the control switch 115 may comprise two spaced flexible arms 120 and 121, insulated by suitable spacer blocks 122 and anchored by a suitable screw 123. The two switch arms 120 and 121 are provided with small contacts 125 which close the motor circuit when brought together. The upper switch arm 120 is bent at its free end, as shown in Fig. 2, so that the offset end 126 of a control arm 127 may be placed between the ends of the two switch arms 120 and 121.

The control switch 115 is biased to its closed position, that is to say, the two switch arms 120 and 121 tend to hold the two contacts 125 together for closing the motor circuit. The offset end 126 of the switch arm has suitable insulation 128 for contact with the two switch arms.

The control arm 127 is mounted on a rocker shaft 130 to which is keyed an upwardly extending rocker arm 131. A suitable rod 132 is mounted in the end of the rocker arm 131 in a position extending along the plurality of detent members 25, as best shown in Figs. 2 and 3.

When none of the control members 26 is latched in its lower effective position a spring 133, connected to the rocker arm 131, causes the offset end 126 of the control arm 127 to depress the lower switch arm 121, as shown in Fig. 2, for holding the two contacts 125 apart. When a push button 88 is depressed to latch a control member in its lower effective position, the consequent movement of the corresponding detent member 25 to the intermediate position shown in Fig. 8 causes sufficient counterclockwise movement of the rocker arm 131, as viewed in Fig. 2, to lift the offset end 126 of the control arm to an intermediate position, thereby permitting the lower switch arm 121 to flex upward for closing of the motor circuit. When the detent member 25 moves to the position shown in Fig. 9, the offset end 126 of the control arm 127 lifts slightly but not enough to affect the control switch; but when the detent member swings to the final locking position shown in Fig. 10, the consequent upward movement of the offset end 126 of the control arm lifts the free end of the upper switch arm 120 sufficiently to open the motor circuit.

It is apparent that in the normal operation of the indexing device, in which one of the control member 26 is always latched, the offset end 126 of the control arm 127 will alternate between an intermediate position at which the control switch 115 is closed and an upper position holding the control switch open. Whenever all of the control members 26 are unlatched to return to their upper retracted positions, the offset end 126 of the control arm will take its lower position to hold the control switch open.

*The modification shown in Figs. 11 and 12*

These two figures show an alternate arrangement that may be employed for frictionally uniting the plurality of indexing members on one of the two shafts, for example the shaft 21.

The shaft $21^a$ in Figs. 11 and 12, corresponding to the shaft 21 in Fig. 7, carries the usual plurality of indexing discs 20 alternating with the associated plurality of plates 36. One end of the assemblage of discs and plates abuts against a split washer 135, and the other end is in contact with means to place the assemblage under pressure by a wedging action.

The pressure applying means comprises a wedge member in the form of a convex disc 140 fixed to the shaft $21^a$, an intermediate pair of radially movable wedge members 141, and a floating wedge member in the form of a second convex disc 142. Each wedge member 141 is of semicircular configuration in profile, as indicated in Fig. 2. The fixed wedge member 140 is anchored to the shaft $21^a$ by a suitable pin 143 extending diametrically through the shaft. The intermediate radially movable wedge members 141 are spaced apart, as indicated in Fig. 12, and may be drawn together with the required force by a suitable screw 145. The screw 145 extends through a smooth bore 146 in one of the wedge members 141, extends through a smooth diametrical bore 147 in the shaft $21^a$, and is threaded into the other radial wedge member. It is apparent that tightening the screw 145 to expand the wedge assembly will frictionally lock the assemblage of discs and plates together and that the screw may be loosened sufficiently to permit any one of the discs to be rotatably adjusted independently of the other discs.

*Operation*

The manner in which the indexing device operates may be readily understood from the foregoing description. Let it be assumed that all of the operating members 26 are in their upper retracted positions, as shown in Fig. 2, with all of the fingers 90 holding all of the detent members 25 in their retracted positions. The motor 65 will be idle because of the offset end 126 of the control arm 127 depresses the lower switch arm 121 to hold the control switch 115 open.

When one of the push buttons 88 is depressed to cause the device to tune in a different station automatically, the corresponding control member 26 becomes latched at its lower effective position, as indicated in Fig. 8, and the corresponding spring 33 pulls the detent member to an intermediate position with the detent tooth 28 in contact with the corresponding second indexing disc 30. The motor switch 115 closes in response to this movement of the detent member 25 to its intermediate position, and the two shafts 21 and 31 are caused to rotate. If the rotation of the shaft 31 brings the pin 60 against the arm 62 of the reversing switch 63 before the indexing notch 32 in the indexing disc 30 reaches the detent tooth 28, the motor will be reversed to reverse the rotation of the two shafts. Eventually the indexing notch 32 in the indexing disc 30 reaches the detent tooth 28, whereupon the detent tooth drops into the notch, as indicated in Fig. 9, and the detent member takes a position with the detent tooth 27 pressing against the periphery of the rotating indexing disc 20. When the indexing notch 22 in the disc 20 registers with the detent tooth 27, the tooth enters the notch as shown in Fig. 10 to immobilize the whole mechanism at the desired station. This final movement of the detent member 25, acting against the rod 132, causes the control switch 115 to open, the offset end 126 of the control arm 127 moving to its upper position.

When a second push button is depressed for tuning in another station, the first control member 26 is automatically unlatched and the second control member becomes latched at its lower effective position to repeat the operating cycle. At the end of the operating cycle the motor will be deenergized by the return of the offset end 126 of the control arm 127 to its upper position.

Whenever it is necessary to make any change or adjustment in the operating cycle controlled by any one of the push buttons, only a simple procedure is required. The push button is depressed to cause the operating cycle to be completed, at the end of which the corresponding detent member 25 is in the locking position shown in Fig. 10. The handle portions 43 and 59 of the eccentric members 42 and 58, respectively, are then moved outward to their release positions so that the two shafts 21 and 31 may be rotated, while the two corresponding indexing discs 20 and 30 are held against rotation by the corresponding detent member 25. The operator then manipulates the knurled ring 48 to tune in the required station with consequent rotation of the two shafts 21 and 31.

It is necessary to end the adjustment procedure with the detent tooth 28 spaced from both the end walls of the corresponding indexing notch 22 to allow for backlash, since an operating cycle may require either direction of rotation of the indexing disc 20. To insure proper positioning of the disc 20 with respect to the detent tooth 28 it is merely necessary to use the knurled ring to rotate the shaft 31 slightly in both directions from the exact tuning point prior to frictionally locking the disc 20. When the two eccentric members 42 and 58 are returned to their normal positions the device is restored to normal operating condition.

The description in specific detail of a preferred embodiment of the invention for the purpose of disclosure and to illustrate the principles involved will suggest to those skilled in the art various changes and substitutions within the scope of my appended claims.

I claim:

1. In an indexing device for positioning a rotary member selectively at a plurality of stations of rotation over an extensive range of several rotations of the member independently of a manual control for the rotary member, a plurality of first indexing means corresponding to said plurality of stations, said indexing means being interconnected for rotation in unison, means for operatively connecting said plurality of first indexing means with said member for rotation of the indexing means through a plurality of rotary positions corresponding to said stations, a plurality of detent means corresponding to said plurality of stations, each of said detent means being movable from a normally retracted position to an effective position for engaging the corresponding first indexing means to stop rotation of said member at the station corresponding to the first indexing means, means to move said detent means selectively to their effective positions, said detent means being biased to their retracted positions, latch means common to all of said detent means to automatically latch the detent means at their effective positions, said latch means being releasable in response to movement of any one of said detent means to an intermediate position, means to move said detent means selectively to their effective positions, means to release said latch means in response to manipulation of said control member for manual rotation of said rotary member, a plurality of second indexing means to correspond to said plurality of stations, said second indexing means being interconnected for movement in unison, each of said second indexing means being adapted to prevent movement of the corresponding detent means to its effective position when the second indexing means is out of a given position, means operatively connecting said plurality of second indexing means with said plurality of first indexing means for simultaneous movement, and means to actuate said two pluralities of indexing means for shifting said member from one of said stations to another.

2. In an indexing device for positioning a rotary shaft selectively at a plurality of stations of rotation over an extensive range of several rotations of the shaft, a plurality of first indexing means corresponding to said plurality of stations, said indexing means being interconnected for rotation in unison at different relative positions of rotation, means for operatively connecting said plurality of first indexing means with said shaft for rotation of the indexing means through a plurality of rotary positions corresponding to said stations, a plurality of pivotally mounted detent members corresponding to said plurality of stations, a plurality of pivotally mounted control members corresponding to said plurality of detent members, means interconnecting the corresponding pairs of said members to cause said detent members to move in response to movements of said control members, means for each corresponding pair of said members to normally hold said members in a retracted pivotal position, each of said control members being pivotable to a station selective position to pivot the corresponding detent members to an effective position for engaging the corresponding first indexing means to stop rotation of the plurality of first indexing means thereby to stop rotation of said shaft at the corresponding station, a plurality of second indexing means corresponding to said plurality of stations, said second indexing means being interconnected for movement in unison, each of said second indexing means being effective to prevent engagement of the corresponding detent members with the corresponding first indexing means when said first indexing means is out of the portion of its range of movement corresponding to the respective station, means operatively connecting said plurality of second indexing means with said plurality of first indexing means for simultaneous movement, and means to actuate said two pluralities of indexing means for shifting said shaft from one of said stations to another.

3. In an indexing device for positioning a rotary shaft selectively at a plurality of stations of rotation over an extensive range of several rotations of the shaft, a plurality of first indexing means corresponding to said plurality of stations, said indexing means being interconnected for rotation in unison at different relative positions of rotation, means for operatively connecting said plurality of first indexing means with said shaft for rotation of the indexing means through a plurality of rotary positions corresponding to said stations, a plurality of pivotally mounted detent members corresponding to said plurality of stations, a plurality of pivotally mounted control members corresponding to said plurality of detent members, means interconnecting the corresponding pairs of said members to cause said detent members to move in response to movements of said control members, means for each corresponding pair of said members to normally hold said members in a retracted pivotal position, each of said control members being pivotable to a station selective position to pivot the corresponding detent members to an effective position for engaging the corresponding first indexing means to stop rotation of the plurality of first indexing means thereby to stop rotation of said shaft at the corresponding station, a plurality of second indexing means corresponding to said plurality of stations, said second indexing means being interconnected for movement in unison, each of said second indexing means being effective to prevent engagement of the corresponding detent members with the corresponding first indexing means when said first indexing means is out of the portion of its range of movement corresponding to the respective station, means operatively connecting said plurality of second indexing means with said plurality of first indexing means for simultaneous movement, means to actuate said two pluralities of indexing means for shifting said shaft from one of said stations to another, and latch means to releasably hold said control members in the station selective position.

4. In an indexing device for positioning a rotary member selectively at a plurality of stations of rotation over an extensive range of several rotations of the member, a plurality of first indexing means corresponding to said plurality of stations, said indexing means being interconnected for rotation in unison at different relative positions of rotation, means for operatively connecting said plurality of first indexing means with said member for rotation of the indexing means through a plurality of rotary positions corresponding to said stations, a plurality of detent members corresponding to said plurality of stations, each of said detent members being movable from a normally retracted position to an effective position for engaging the corresponding first indexing means to stop rotation of the plurality of first indexing means thereby to stop rotation of said rotary member at the station corresponding to the first indexing means, a plurality of control members corresponding to said plurality of stations each being movable from a retracted position to a position effective to urge the corresponding detent members to its effective position, a plurality of second indexing means corresponding to said plurality of stations, said second indexing means being interconnected for movement in unison, each of said second indexing means being effective to prevent engagement of the corresponding detent members with the corresponding first indexing means when said first indexing means is out of the portion of its range of movement corresponding to the respective station, means operatively connecting said plurality of second indexing means with said plurality of first indexing means for simultaneous movement, means to actuate said two pluralities of indexing means for shifting said rotary member from one of said stations to another, and a latch means common to all of said control members for holding the control members in their effective positions, said latch means being releasable in response to movement of any one control member to a position short of its effective position whereby moving any one control member to its effective position for latching at the effective position automatically releases a previously latched control member.

5. In an indexing device for positioning a rotary member selectively at a plurality of stations of rotation over an extensive range of several rotations of the member, a plurality of first indexing means corresponding to said plurality of stations, said indexing means being interconnected for rotation in unison at different relative positions of rotation, means for operatively connecting said plurality of first indexing means with said member for rotation of the indexing means through a plurality of rotary positions corresponding to said stations, a plurality of detent members corresponding to said plurality of stations, each of said detent members being movable from a normally retracted position to an effective position for engaging the corresponding first indexing means to stop rotation of the plurality of first indexing means thereby to stop rotation of said rotary member at the station corresponding to the first indexing means, a plurality of control members corresponding to said plurality of stations each being movable from a retracted position to a position effective to urge the corresponding detent members to its effective position, a plurality of second indexing means corresponding to said plurality of stations, said second indexing means being interconnected for movement in unison, each of said second indexing means being effective to prevent engagement of the corresponding detent members with the corresponding first indexing means when said first indexing means is out of the portion of its range of movement corresponding to the respective station, means operatively connecting said plurality of second indexing means with said plurality of first indexing means for simultaneous movement, means to actuate said two pluralities of indexing means for shifting said rotary member from one of said stations to another, a latch means common to all of said control members for holding the control members in their effective positions, said latch means being releasable in response to movement of any one control member to a position short of its effective position whereby moving any one control member to its effective position for latching automatically releases a previously latched control member, and means to move said latch means to its release position independently of said control means.

6. In an indexing device for positioning a rotary shaft selectively at a plurality of stations of rotation over an extensive range of several rotations of the shaft, a plurality of first indexing means corresponding to said plurality of stations, said indexing means being interconnected for rotation in unison at different relative positions of rotation, means for operatively connecting said plurality of first indexing means with said shaft for rotation of the indexing means through a plurality of rotary positions corresponding to said stations, a plurality of pivotally mounted detent members corresponding to said plurality of stations, a plurality of pivotally mounted control members corresponding to said plurality of detent members, means interconnecting the corresponding pairs of said members to cause said detent members to move in response to movements of said control members, means for each corresponding pair of members to normally hold said members in a retracted pivotal position, each of said control members being pivotable to a station selective position to pivot the corresponding detent members from a retracted position through an ineffective intermediate position to a position for engaging the corresponding first indexing means to stop rotation of the plurality of first indexing means thereby to stop rotation of said shaft at the corresponding station, a plurality of second indexing means corresponding to said plurality of stations, said second indexing means being interconnected for movement in unison, each of said second indexing means being effective to block the corresponding detent members at the intermediate position when said first indexing means is out of the portion of its range of movement corresponding to the respective station, means operatively connecting said plurality of second indexing means with said plurality of first indexing means for simultaneous movement, an electric motor for rotating said shaft, a switch to control the energization of said motor, and means to close said switch when said detent member is moved to said intermediate position and to open said switch when said detent member is moved into the effective position.

7. In an indexing device for positioning a rotary shaft selectively at a plurality of stations of rotation over an extensive range of several rotations of the shaft, a plurality of first indexing means corresponding to said plurality of stations, said indexing means being interconnected for rotation in unison at different relative positions of rotation, means for operatively connecting said plurality of first indexing means with said shaft for rotation of the indexing means through a plurality of rotary positions corresponding to said stations, a plurality of pivotally mounted detent members corresponding to said plurality of stations, a plurality of pivotally mounted control members corresponding to said plurality of detent members, means urging said control members into a retracted position, means interconnecting each corresponding pair of said members to hold said detent member in a retracted position when said control member is in the retracted position, each of said control members being pivotable to a station selective position, means to move said detent member into an intermediate position in response to the movement of the corresponding control member into a station selective position and to urge said detent member into an effective position, a plurality of second indexing means corresponding to said plurality of stations, said second indexing means being interconnected for movement in unison, each of said second indexing means being effective to block the corresponding detent member in the intermediate position when said first indexing means is out of the portion of its range of movement corresponding to the respective station, said second indexing means being recessed to unblock the corresponding detent member when said first indexing means is in the portion of its range corresponding to the respective station whereby the detent member is effective for engaging the corresponding first indexing means to stop rotation of the plurality of first indexing means to stop rotation of said shaft at the corresponding station, means operatively connecting said plurality of second indexing means with said plurality of first indexing means for simultaneous movement, and means to actuate said two pluralities of indexing means for shifting said shaft from one of said stations to another.

MERLE D. TYLER.

REFERENCES CITED

The following references are of record in the file of this patent:

UNITED STATES PATENTS

| Number | Name | Date |
|---|---|---|
| 1,704,754 | Marvin | Mar. 12, 1929 |
| 2,153,865 | Gersch | Apr. 11, 1939 |
| 2,214,785 | Wells | Sept. 17, 1940 |
| 2,285,414 | Collins | June 9, 1942 |
| 2,334,724 | Paessler | Nov. 23, 1943 |
| 2,391,470 | May | Dec. 25, 1945 |
| 2,413,211 | Brian | Dec. 24, 1946 |